(12) United States Patent
Zhang et al.

(10) Patent No.: US 11,462,492 B2
(45) Date of Patent: Oct. 4, 2022

(54) SUBSTRATE AND METHOD OF MANUFACTURING THE SAME, METHOD OF MANUFACTURING MOTHERBOARD, MASK AND EVAPORATION DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Wei Zhang, Beijing (CN); Peng Cao, Beijing (CN); Longhui Xue, Beijing (CN); Jianchang Cai, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 351 days.

(21) Appl. No.: 16/850,472

(22) Filed: Apr. 16, 2020

(65) Prior Publication Data
US 2021/0167025 A1 Jun. 3, 2021

(30) Foreign Application Priority Data
Nov. 29, 2019 (CN) .......................... 201911205846.8

(51) Int. Cl.
*H01L 23/60* (2006.01)
*C23C 14/04* (2006.01)
(Continued)

(52) U.S. Cl.
CPC ............ *H01L 23/60* (2013.01); *C23C 14/042* (2013.01); *C23C 14/24* (2013.01);
(Continued)

(58) Field of Classification Search
CPC ............ C23C 14/042; H01L 2227/323; H01L 51/0011; H01L 23/60; H01L 51/001; H01L 51/56
See application file for complete search history.

(56) References Cited

U.S. PATENT DOCUMENTS

2003/0180474 A1  9/2003  Nishikawa
2005/0116236 A1  6/2005  Park et al.
(Continued)

FOREIGN PATENT DOCUMENTS

CN    1302147 C     2/2007
CN    100403857 C   7/2008
(Continued)

OTHER PUBLICATIONS

Notification of the First Office Action issued in Chinese Application No. 201911205846.8, dated Oct. 11, 2021; with English translation.

*Primary Examiner* — Jaehwan Oh
(74) *Attorney, Agent, or Firm* — McDermott Will & Emery LLP

(57) ABSTRACT

A substrate includes a first base, a pixel defining layer and spacers. The pixel defining layer disposes above the first base and has a plurality of openings. The pixel defining layer includes a first pixel defining sub-layer and a second pixel defining sub-layer stacked in a direction away from the first base. The spacers dispose on a surface of the pixel defining layer facing away from the first base. The second pixel defining sub-layer includes a first conductive material doped at least in a surface of the second pixel defining sub-layer facing away from the first base, the spacers include a second conductive material doped at least in surfaces of the spacers facing away from the first base.

19 Claims, 7 Drawing Sheets

(51) Int. Cl.
*C23C 14/24* (2006.01)
*H01L 27/32* (2006.01)
*H01L 51/00* (2006.01)
*H01L 51/56* (2006.01)

(52) U.S. Cl.
CPC ........ *H01L 27/3246* (2013.01); *H01L 51/001* (2013.01); *H01L 51/0011* (2013.01); *H01L 51/56* (2013.01); *H01L 2227/323* (2013.01)

(56) References Cited

U.S. PATENT DOCUMENTS

| | | | | |
|---|---|---|---|---|
| 2008/0246029 | A1* | 10/2008 | Kang | H01L 27/124 |
| | | | | 257/E27.111 |
| 2008/0277666 | A1* | 11/2008 | Jeon | H01L 27/3244 |
| | | | | 257/E21.414 |
| 2016/0190220 | A1* | 6/2016 | Hsu | H01L 27/3265 |
| | | | | 438/166 |
| 2016/0343828 | A1* | 11/2016 | Hsu | H01L 29/78621 |
| 2017/0003800 | A1 | 1/2017 | Zhu | |
| 2017/0133446 | A1* | 5/2017 | Hsu | H01L 27/3258 |
| 2017/0141355 | A1* | 5/2017 | Hsu | H01L 27/3265 |
| 2018/0033883 | A1* | 2/2018 | Zhou | H01L 27/1255 |
| 2018/0226302 | A1* | 8/2018 | Zhou | H01L 27/1222 |
| 2018/0261797 | A1 | 9/2018 | Lee | |
| 2019/0203338 | A1 | 7/2019 | Kawasaki et al. | |
| 2020/0251595 | A1* | 8/2020 | Zhang | H01L 27/1222 |
| 2020/0258974 | A1* | 8/2020 | Zhang | H01L 51/0097 |
| 2021/0118964 | A1 | 4/2021 | Gong et al. | |
| 2021/0407330 | A1* | 12/2021 | Zheng | H01L 27/3241 |

FOREIGN PATENT DOCUMENTS

| | | |
|---|---|---|
| CN | 104750284 A | 7/2015 |
| CN | 106449726 A | 2/2017 |
| CN | 107460437 A | 12/2017 |
| CN | 108470756 A | 8/2018 |
| CN | 108573993 A | 9/2018 |
| CN | 108866479 A | 11/2018 |
| CN | 109154064 A | 1/2019 |
| CN | 110137238 A | 8/2019 |
| CN | 110447107 A | 11/2019 |
| EP | 1 096 568 A2 | 5/2001 |
| JP | 2005-005071 A | 1/2005 |
| KR | 10-2008-0014328 A | 2/2008 |
| KR | 10-2017-0041487 A | 4/2017 |
| WO | 2016/178370 A1 | 11/2016 |
| WO | 2019/173946 A1 | 9/2019 |

* cited by examiner

SUBSTRATE AND METHOD OF MANUFACTURING THE SAME, METHOD OF MANUFACTURING MOTHERBOARD, MASK AND EVAPORATION DEVICE

CROSS-REFERENCE TO RELATED APPLICATION

This application claims priority to Chinese Patent Application No. 201911205846.8 filed Nov. 29, 2019, which is incorporated herein by reference in its entirety.

TECHNICAL FIELD

The present disclosure relates to the field of display technologies, and in particular, to a substrate and a method of manufacturing the same, a method of manufacturing motherboard, a mask and an evaporation device.

BACKGROUND

An organic light-emitting diode (OLED) display has the advantages of wide display color gamut, fast response speed, being foldable and the like.

SUMMARY

In one aspect, a substrate is provided. The substrate includes a first base, a pixel defining layer, and spacers. The pixel defining layer is disposed above the first base, and the pixel defining layer has a plurality of openings. The pixel defining layer includes a first pixel defining sub-layer and a second pixel defining sub-layer stacked in a direction away from the first base. The spacer is disposed on a surface of the pixel defining layer facing away from the first base. The second pixel defining sub-layer includes a first conductive material doped at least in a surface of the second pixel defining sub-layer facing away from the first base, and the spacers include a second conductive material doped at least in surfaces of the spacers facing away from the first base.

In some embodiments, a thickness of the second pixel defining sub-layer is approximately ⅓ to approximately ½ of a thickness of the pixel defining layer.

In some embodiments, the substrate further includes an organic material functional layer disposed in each opening. A thickness of the first pixel defining sub-layer is greater than a thickness of the organic material functional layer.

In some embodiments, a material of the second pixel defining sub-layer includes a first dielectric material doped with a first conductive material. And the spacers include a second dielectric material doped with a second conductive material.

In some embodiments, the first conductive material in the second pixel defining sub-layer has a doping concentration of 1 wt % to 10 wt %, and the second conductive material in the spacers has a doping concentration of 1 wt % to 10 wt %.

In some embodiments, a material of the second pixel defining sub-layer and a material of the spacers are a same dielectric material doped with a same conductive material.

In some embodiments, the first conductive material includes at least one of carbon black or graphite. The second conductive material includes at least one of carbon black or graphite.

In some embodiments, a material of the first pixel defining sub-layer is a third dielectric material.

In some embodiments, the substrate further includes a plurality of anodes and cathodes. The plurality of anodes are disposed between the first base and the pixel defining layer, and each anode corresponds to a respective one of the plurality of openings. The cathode cover the organic material functional layer, the pixel defining layer, and the spacers.

In another aspect, a method of manufacturing a motherboard including a plurality of substrates as described above is provided. The method includes: forming a first motherboard pixel defining sub-layer above a second base by using a third dielectric material; forming a second motherboard pixel defining sub-layer on the first motherboard pixel defining sub-layer by using a first dielectric material doped with a first conductive material; and forming spacers on the second motherboard pixel defining sub-layer by using a second dielectric material doped with a second conductive material.

In some embodiments, a thickness of the second motherboard pixel defining sub-layer is approximately ⅓ to approximately ½ of a sum of a thicknesses of the first motherboard pixel defining sub-layer and a thickness of the second motherboard pixel defining sub-layer.

In some embodiments, the second motherboard pixel defining sub-layer and the spacers are formed through one patterning process by using a same dielectric material doped with a same conductive material.

In some embodiments, the first dielectric material, the second dielectric material, and the third dielectric material are a same dielectric material.

In some embodiments, forming the first motherboard pixel defining sub-layer, the second motherboard pixel defining sub-layer, and the spacers includes: forming a third dielectric layer on the second base by using the third dielectric material; forming a first dielectric layer on the third dielectric layer by using the same dielectric material doped with the same conductive material; patterning the first dielectric layer to form the second motherboard pixel defining sub-layer and the spacers; and patterning the third dielectric layer to form the first motherboard pixel defining sub-layer.

In some embodiments, before forming the second motherboard pixel defining sub-layer and the spacers, the method further includes: doping the same conductive material into the same dielectric material to obtain the same dielectric material doped with the same conductive material.

In some embodiments, after the spacers are formed, the method further includes: placing a mask in a way that a surface of the mask formed with a plurality of grooves is in contact with the spacers, and evaporating an organic material functional layer in an opening defined by the first motherboard pixel defining sub-layer and the second motherboard pixel defining sub-layer, wherein a thickness of a formed organic material functional layer is smaller than a thickness of the first motherboard pixel defining sub-layer.

In yet another aspect, a method of manufacturing a substrate is provided. The method of manufacturing the substrate includes: cutting the motherboard manufactured by the method described above to obtain the substrates.

In yet another aspect, a mask applied in manufacturing the substrate described above is provided, and the mask includes a frame and a mask body. The mask body is fixed on the frame. A plurality of grooves are formed in a surface of the mask body facing away from the frame. A dimension of a cross section of each groove is 1 μm to 5 μm, and a depth of the groove is greater than 0 μm and less than or equal to 3 μm.

In yet another aspect, an evaporation device is provided. The evaporation device includes a cavity, an evaporation source and the mask described above. The evaporation source and the mask are disposed in the cavity.

BRIEF DESCRIPTION OF THE DRAWINGS

In order to describe technical solutions in the present disclosure more clearly, accompanying drawings to be used in some embodiments of the present disclosure will be introduced briefly. Obviously, the accompanying drawings to be described below are merely accompanying drawings of some embodiments of the present disclosure, and a person of ordinary skill in the art can obtain other drawings according to these drawings without paying any creative effort. In addition, accompanying drawings in the following description may be regarded as schematic diagrams, and are not limitations on an actual size of a product, an actual process of a method and an actual timing of signals that the embodiments of the present disclosure relate to.

DETAILED DESCRIPTION

Figure 1:
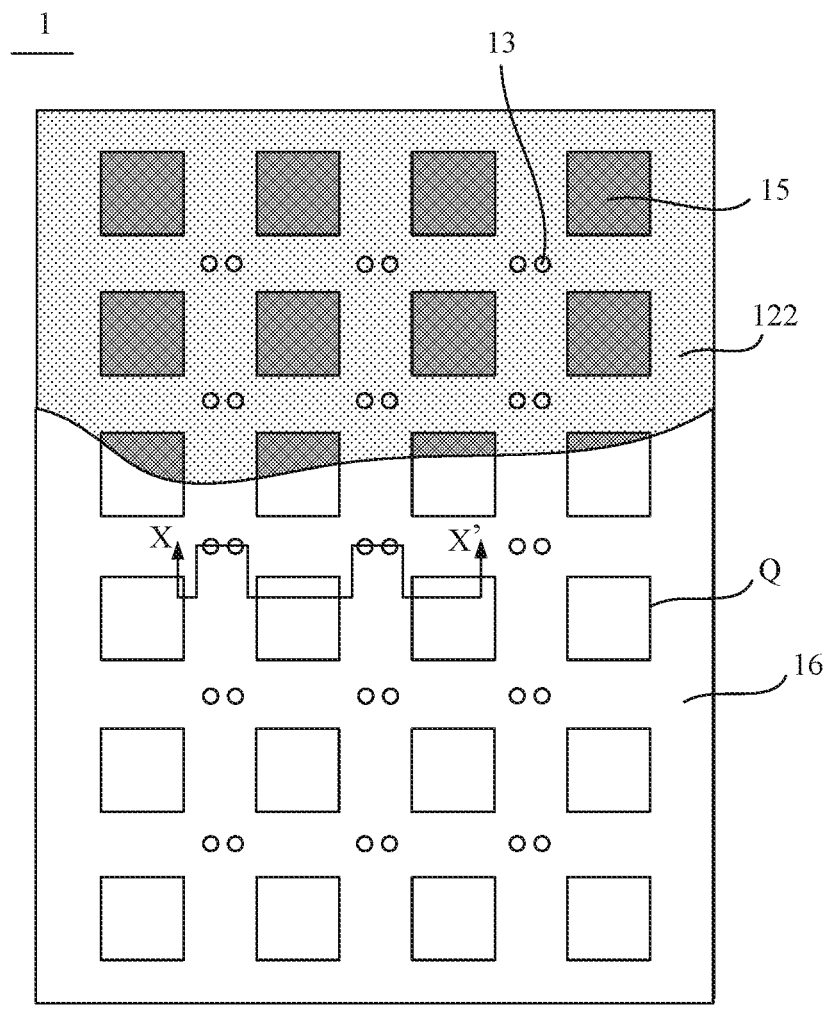
FIG. 1 is a schematic top view of a substrate, in accordance with some embodiments.

Technical solutions in some embodiments of the present disclosure will be described clearly and completely with reference to accompanying drawings. Obviously, the described embodiments are merely some but not all of the embodiments of the present disclosure. All other embodiments obtained on a basis of the embodiments of the present disclosure by a person of ordinary skill in the art shall be included in the protection scope of the present disclosure.

Unless the context requires otherwise, the term "comprise" and other forms thereof such as the third-person singular form "comprises" and the present participle form "comprising" in the description and the claims are construed as open and inclusive, i.e., "inclusive, but not limited to". In the description of the description, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

The terms such as "first" and "second" are used for descriptive purposes only and cannot be construed as indicating or implying the relative importance or implicitly indicating the number of indicated technical features below. Thus, features defined as "first" and "second" may explicitly or implicitly include one or more of the features. In the description of the embodiments of the present disclosure, term "plurality" means two or more unless otherwise specified.

In the description of embodiments of the present disclosure, it will be understood that orientations or positional relationships indicated by terms "center", "upper", "lower", "front", "rear", "left", "right", "vertical", "horizontal", "top", "bottom", "inner", "outer", etc. are based on orientations or positional relationships shown in the drawings, which is merely to facilitate and simplify the description of the present disclosure, and is not to indicate or imply that the referred devices or elements must have a particular orientation, or must be constructed or operated in a particular orientation. Therefore, they should not be construed as limitations to the present disclosure.

As used herein, "about" or "approximately" includes the stated value and the average value within a range of acceptable deviations from the stated value. The range of acceptable deviations is determined by one of ordinary skill in the art taking into account measurement in question and errors associated with measurement of a particular quantity (i.e., limitations of a measurement system).

In the related art, in a case where a display panel with a large size is manufactured, there is a large contact area between a mask and a substrate to be evaporated after the mask is closely fitted to the substrate to be evaporated in an evaporation process. Therefore, a large separating force is required in separating the mask and the substrate after the evaporation (i.e., it is difficult to separate the mask and the substrate), so that friction between the mask and the substrate is increased, and the substrate after evaporation carries more electrostatic charge. More electrostatic charge may cause an electrostatic damage of electrodes of sub-pixels in the substrate, causing the sub-pixels to fail to emit light. Here, the electrostatic charge refers to charges in an electrostatic state existing on a surface of an object, which may be generated by mutual friction between two objects.

Figure 2:
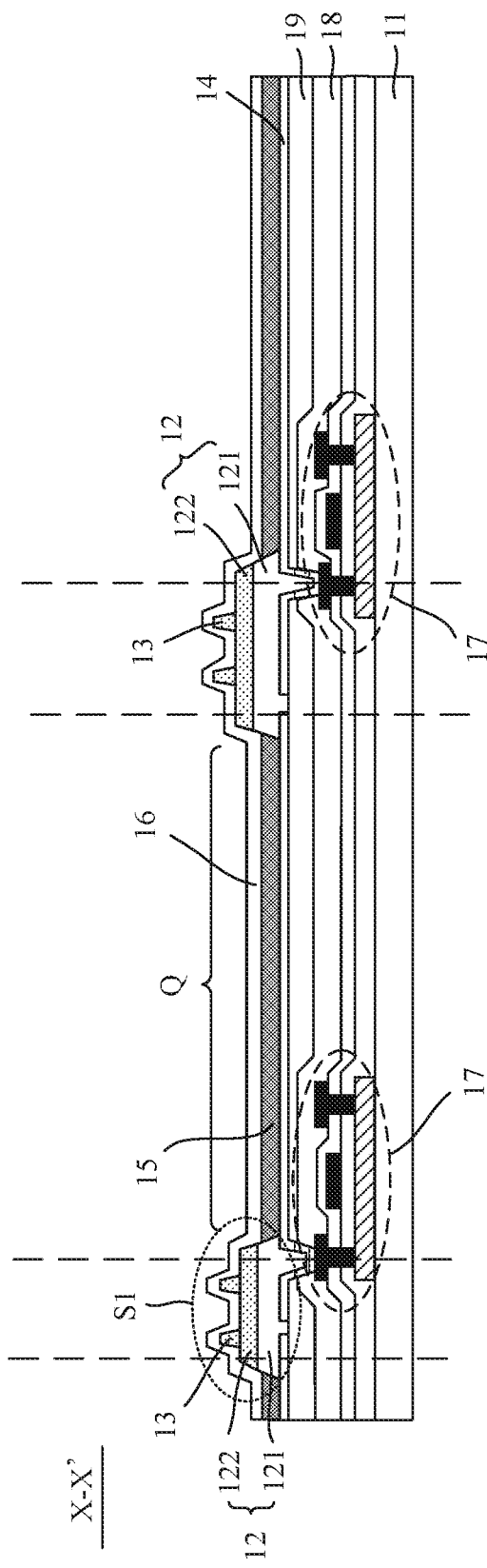
FIG. 2 is a section of the substrate in FIG. 1 along the section line X-X'.

Some embodiments of the present disclosure provide a substrate 1. As shown in FIGS. 1 and 2, the substrate 1 includes a first base 11, a pixel defining layer 12 disposed above the first base 11, and spacers 13 disposed on a surface of the pixel defining layer 12 facing away from the first base 11. The pixel defining layer 12 has a plurality of openings Q. The pixel defining layer 12 includes a first pixel defining sub-layer 121 and a second pixel defining sub-layer 122 which are stacked in a direction away from the first base 11. That is, in the pixel defining layer 12, the first pixel defining sub-layer 121 is more proximate to the first base 11 than the second pixel defining sub-layer 122. The second pixel defining sub-layer 122 includes a first conductive material doped at least in a surface of the second pixel defining sub-layer 122 facing away from the first base 11, and the spacers 13 include a second conductive material doped at least in surfaces of the spacers 13 facing away from the first base 11.

Since the second pixel defining sub-layer 122 and the spacers 13 include respective conductive materials at least in their respective surfaces facing away from the first base 11, in a case where the substrate 1 and the metal mask are separated after evaporation, electrostatic charge on a surface of substrate 1 in contact with the metal mask may be conducted from the substrate 1 to the metal mask through the conductive material, so that accumulation of electrostatic charge on the substrate 1 may be avoided. That is, probability of electrostatic damage of electrodes of sub-pixels in the substrate 1 may be reduced, and the product yield is improved.

Here, the term "conductive material" in the first and second conductive materials refers to a material with a surface resistivity of less than 105 Ω/sq and greater than 0 Ω/sq, where sq is an abbreviation of square, and Ω/sq is ohm per square and is a unit of square resistance. The square resistance refers to a resistance of a thin film with a certain thickness and an equal length and width, and is also called sheet resistivity or area resistivity. The square resistance is related to the properties of the material and the thickness of the film, but not to the area.

Here, types of the first conductive material and the second conductive material are not limited. For example, the first conductive material includes at least one of carbon black or graphite. That is, the first conductive material is carbon black; or the first conductive material is graphite; or the first conductive material includes carbon black and graphite. For example, the second conductive material includes at least one of carbon black or graphite. That is, the second conductive material is carbon black; or the second conductive material is graphite; or the second conductive material includes carbon black and graphite. The carbon black and the graphite are good conductors, which may discharge electrostatic charge carried by the substrate 1 and thus reduces voltage loss on a cathode. Besides, the carbon black and the graphite also have good corrosion resistance, which may improve corrosion resistance of the pixel defining layer 12 and the spacers 13.

In addition, that the second pixel defining sub-layer 122 includes a first conductive material doped at least in a surface of the second pixel defining sub-layer 122 facing away from the first base 11" includes the following implementations. The second pixel defining sub-layer 122 has the first conductive material doped in the surface of the second pixel defining sub-layer 122 facing away from the first base 11. Or, the second pixel defining sub-layer 122 has the conductive material doped in the surface of the pixel defining sub-layer 122 facing away from the first base 11 and in other portions (not necessarily all other portions) of the pixel defining sub-layer 122. For example, the second pixel defining sub-layer 122 has the first conductive material doped throughout therein.

In addition, that "spacers 13 include a second conductive material doped at least in the surfaces of the spacers 13 facing away from the first base 11" includes the following implementations. The spacers 13 have the second conductive material doped in the surfaces of the spacers 13 facing away from the first base 11. Or, the spacers 13 have the second conductive material doped in the surfaces of the spacers 13 facing away from the first base 11 and in other portions (not necessarily all other portions) of the spacers 13. For example, the photo spacer 13 has the second conductive material doped throughout therein.

For example, referring to FIGS. 1 and 2, the second pixel defining sub-layer 122 includes a first dielectric material doped with the first conductive material, and the photo spacers 13 include a second dielectric material doped with the second conductive material. Here, a doping concentration of the first conductive material may be equal to that of the second conductive material, or may not be equal to that of the second conductive material.

Figure 3:
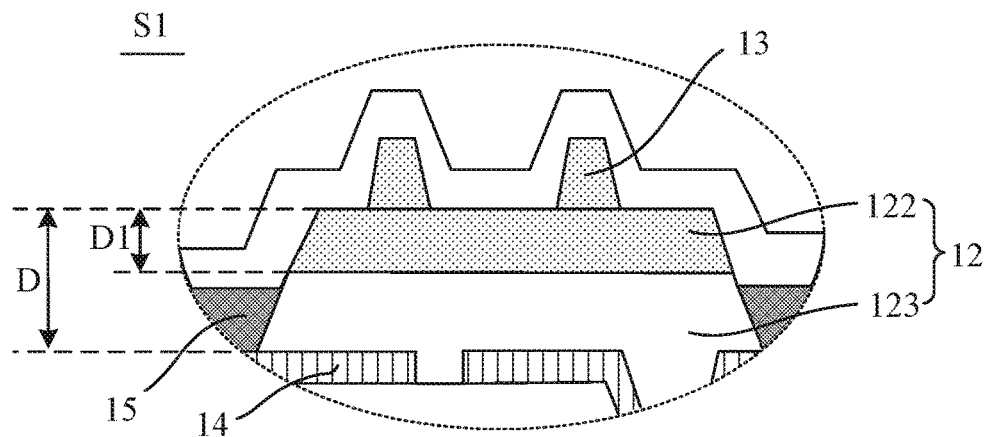
FIG. 3 is a partial enlargement view of the area S1 in FIG. 2.

In some embodiments, the material of the first pixel defining sub-layer 121 is a third dielectric material. Here, the first dielectric material, the second dielectric material and the third dielectric material may be the same dielectric material, for example, polyimide (abbreviated as PI). As shown in FIGS. 2 and 3, in a case where the second pixel defining sub-layer 122 has the first conductive material doped therein, a short circuit between the cathode 16 and an anode 14 in each sub-pixel may be prevented by the first pixel defining sub-layer 121 including the third dielectric material. In this way, the pixel defining layer 12 may reduce aggregation of electrostatic charge in the substrate 1 after evaporation, and may prevent the short circuit from existing between the cathode 16 and the anode 14 in each sub-pixel.

It will be noted that the word "doped" here refers to adding a material to a base material in small quantities. For example, the first conductive material in the second pixel defining sub-layer 122 has a doping concentration of 1 wt % to 10 wt %, and the second conductive material in the photo spacers 13 has a doping concentration of 1 wt % to 10 wt %. That is, a mass of the first conductive material accounts for a range of 1% to 10% of a total mass of the second pixel defining sub-layer 122, and a mass of the second conductive material accounts for a range of 1% to 10% of a total mass of the photo spacers 13.

The second pixel defining sub-layer 122 and the spacers 13 may have a good effect of discharging the electrostatic charge by limiting the doping concentration of their respective conductive material. Meanwhile, properties such as thermal stability and film formability of the pixel defining layer 12 are not affected, that is, the pixel defining layer 12 has good thermal stability and film formability.

In some embodiments, the second pixel defining sub-layer 122 and the spacers 13 include the same dielectric material doped with the same conductive material of the same doping concentration. That is, the first dielectric material and the second dielectric material are the same dielectric material, which is doped with the same conductive material of the same doping concentration. For example, the materials of the second pixel defining sub-layer 122 and the spacers 13 are polyimide (PI) doped throughout with graphite of 5 wt %. For another example, the materials of the second pixel defining sub-layer 122 and the spacers 13 are polyimide doped throughout with carbon black of 5 wt %. In this case, the second pixel defining sub-layer 122 and the spacers 13 may be formed by a same patterning process which may include coating photoresist, exposing the coated photoresist, developing the exposed photoresist, etching and removing photoresist, thereby simplifying the process.

In some embodiments, referring to FIGS. 2 and 3, a thickness D1 of the second pixel defining sub-layer 122 is approximately one third (⅓) to approximately half (½) of a thickness D of the pixel defining layer 12. For example, the thickness D1 of the second pixel defining sub-layer 122 is approximately ⅓ of the thickness D of the pixel defining layer 12. For another example, the thickness D1 of the second pixel defining sub-layer 122 is approximately ½ of the thickness D of the pixel defining layer 12.

In this way, the thickness D1 of the second pixel defining sub-layer 122 may be prevented from being large, and the thickness of the first pixel defining sub-layer 121 may be prevented from being small. In this way, the first pixel defining sub-layer 121 may be prevented from being broken down, and thus the pixel defining layer 12 may be prevented from being broken down. In addition, a defect of poor electrostatic discharge effect caused by a small thickness D1 of the second pixel defining sub-layer 122 may be avoided.

In some other embodiments, referring to FIGS. 1 and 2, the substrate 11 further includes an organic material functional layer 15 disposed in each opening Q of the pixel defining layer 12. The thickness of the first pixel defining sub-layer 121 is greater than a thickness of the organic material functional layer 15. That is, a difference between the thickness D of the pixel defining layer 12 and the thickness D1 of the second pixel defining sub-layer 122 is greater than the thickness of the organic material functional layer 15. In this way, the second pixel defining sub-layer 122 may be prevented from being in contact with the organic material functional layer 15, so that a voltage of the organic material functional layer 15 may be prevented from being influenced when the organic material functional layer 15 emits light. That is, an influence of the second pixel defining sub-layer 122 on the light emitting effect of the organic material functional layer 15 may be avoided.

It will be noted that the organic material functional layer 15 includes a light-emitting layer. For example, in addition to the light-emitting layer, the organic material functional layer 15 further includes at least one of an electron transporting layer (ETL), an election injection layer (EIL), a hole transporting layer (HTL), or a hole injection layer (HIL).

On this basis, in some embodiments, referring to FIGS. 1 and 2, the substrate 1 further includes a plurality of anodes 14 and a cathode 16. The anodes 14 are disposed between the first base 11 and the pixel defining layer 12, and are disposed in one-to-one correspondence with the openings Q. The cathode 16 covers all the organic material functional layers 15, the pixel defining layer 12 and the spacers 13. For example, the cathode 16 may be a continuous film structure.

It will be noted that the cathode 16 is in contact with surfaces of the second pixel defining sub-layer 122 and the spacers 13 facing away from the first base 11. The surfaces contain conductive materials (including the first conductive material and the second conductive material), which is equivalent to connecting a resistor in parallel with the cathode 16, thereby reducing a voltage loss on the cathode 16.

In some examples, the anodes 14 are opaque. For example, each anode 14 is a laminated structure composed of an ITO (Indium Tin oxide) layer, a silver (Ag) layer and an ITO layer. The cathode 16 is transparent or translucent. For example, the cathode 16 is a silver layer with a thickness so small that the cathode 16 appears transparent or translucent. It will be noted that the cathode 16 appears transparent or translucent when the thickness of the silver layer is small enough. In this case, the substrate 1 is a top emission substrate.

In some other examples, the anode 14 is transparent or translucent. For example, the material of the anode 14 is ITO. The cathode 16 is opaque. For example, the material of the cathode is silver, or the cathode 16 has a laminated structure composed of an ITO layer, a silver layer and an ITO layer. In this case, the substrate 1 is a bottom emission substrate.

With continuous reference to FIGS. 1 and 2, in some embodiments, the substrate 1 further includes pixel driving circuits disposed between the first base 11 and the anodes 14. Each pixel driving circuit includes a plurality of transistors, such as a driving transistor 17 in FIG. 2, and a source or a drain of the driving transistor 17 is electrically connected to a corresponding anode 14.

In some embodiments, as shown in FIGS. 1 and 2, the substrate 1 further includes a passivation layer 18 disposed between driving transistors 17 and the anodes 14, and a planarization layer 19 disposed between the passivation layer 18 and the anodes 14. Via holes extending through the passivation layer 18 and the planarization layer 19 are provided, and the source or the drain of the driving transistor 17 is electrically connected to the anode 15 through at least one via hole.

Figure 4:
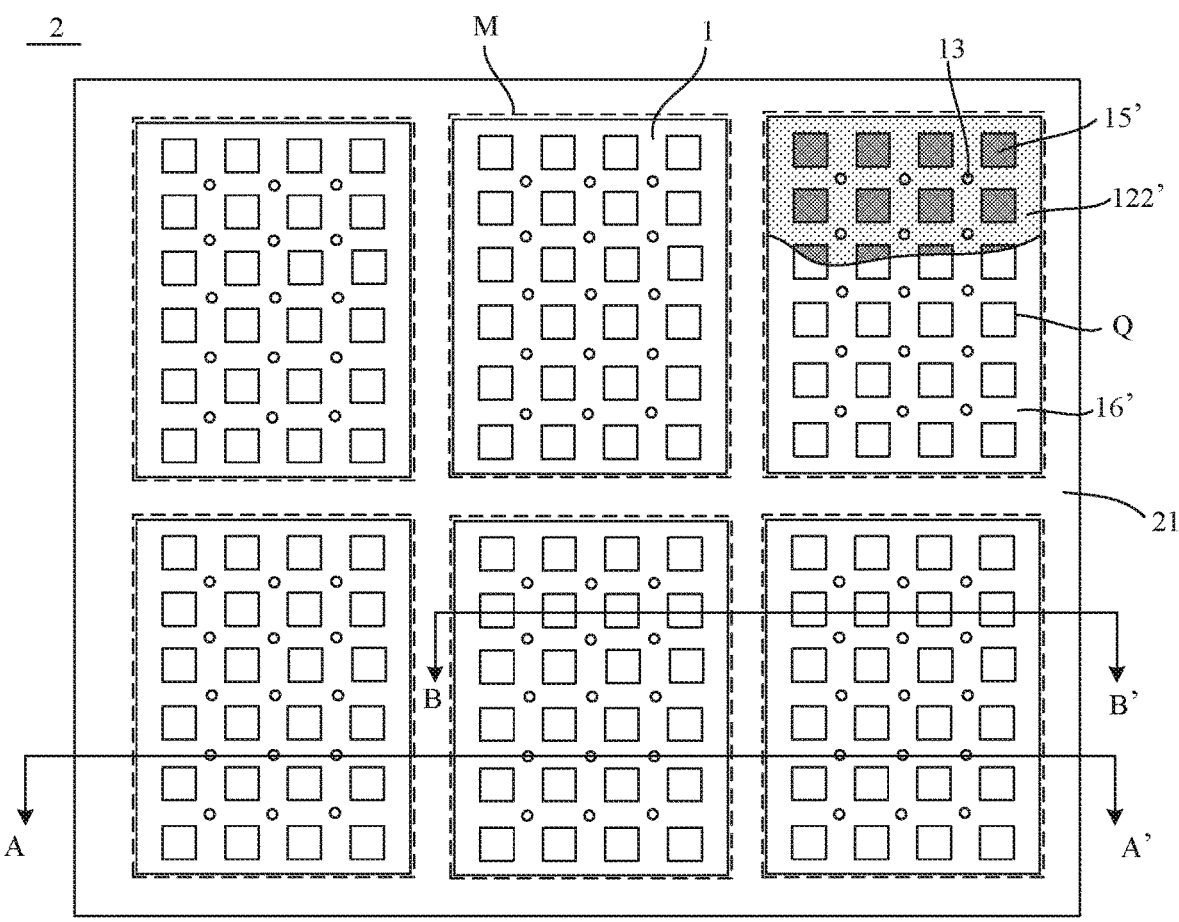
FIG. 4 is a schematic top view of a motherboard, in accordance with some embodiments.
Figure 5:
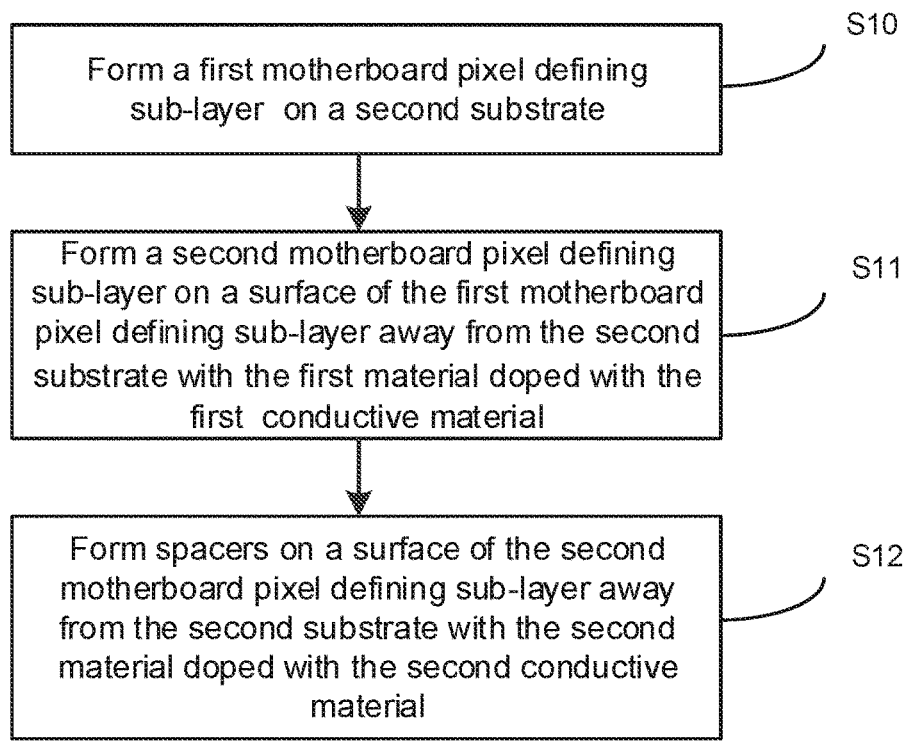
FIG. 5 is a flow chart of a method of manufacturing a motherboard, in accordance with some embodiments.

Some embodiments of the present disclosure provide a method of manufacturing a motherboard, which may be applied to manufacturing a motherboard 2 shown in FIG. 4. The motherboard 2 has a plurality of first regions M disposed at intervals, and each first region M corresponds to a substrate to be formed, which may form the substrate 1 described in any embodiment above.

Referring to FIG. 4 to FIG. 7, the method of manufacturing the motherboard 2 includes the following S10 to S13.

In S10, a first motherboard pixel defining sub-layer 121' is formed above a second base 21 by using a third dielectric material.

In 311, a second motherboard pixel defining sub-layer 122' is formed on the first motherboard pixel defining sub-layer 121° by using a first dielectric material doped with the first conductive material.

In S12, the spacers 13 are formed on the second motherboard pixel defining sub-layer 122' by using a second dielectric material doped with the second conductive material.

In the method of manufacturing the motherboard 2, since the second motherboard pixel defining sub-layer 122' includes the first conductive material and the spacers 13 include the second conductive material, in a case where the substrate 1 and a mask are separated after the evaporation, the electrostatic charge on the surface of the mask in contact with the motherboard 2 may be conducted from the substrate 1 to the mask through the conductive material, so that the electrostatic charge may be prevented from accumulating on the substrate 1. Therefore, the manufacturing method may reduce the probability of electrostatic damage of electrodes of sub-pixels in the substrate 1 and improve a product yield.

In some embodiments, a thickness D1 of the second motherboard pixel defining sub-layer 122' is approximately one third (⅓) to approximately half (½) of a sum D of a thickness of the first motherboard pixel defining sub-layer 121' and a thickness of the second motherboard pixel defining sub-layer 122'.

Figure 6:
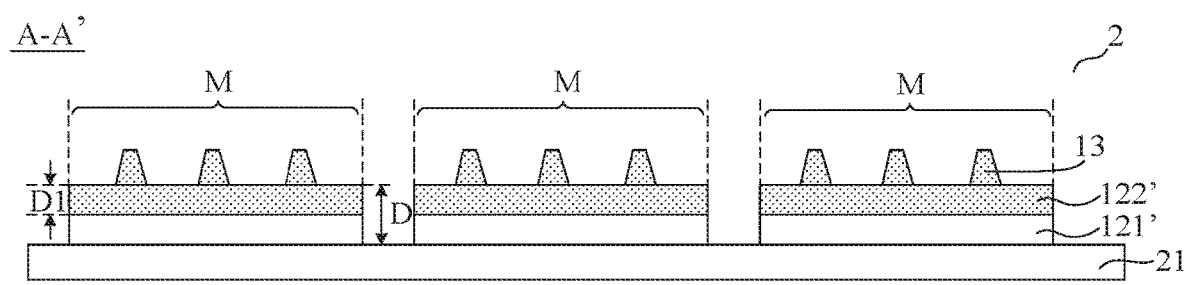
FIG. 6 is a section of the motherboard in FIG. 4 along the section line A-A'.
Figure 7:
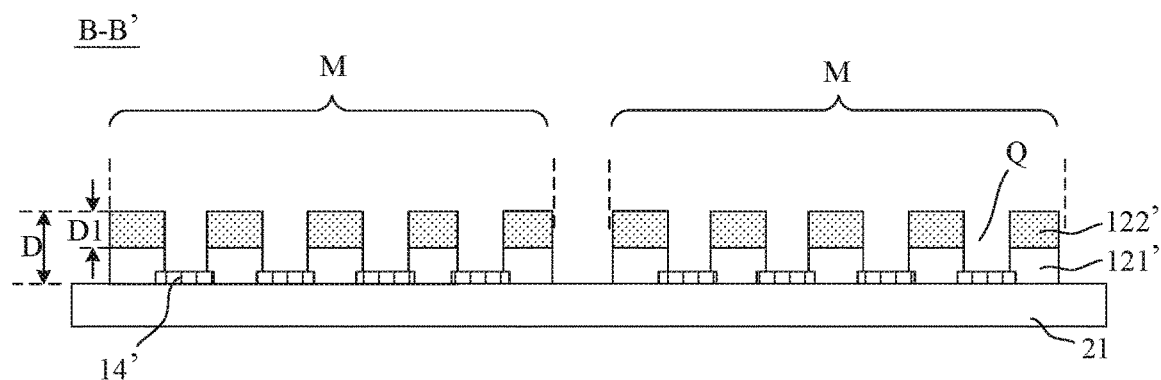
FIG. 7 is a section of the motherboard in FIG. 4 along the section line B-B'.

In some embodiments, referring to FIGS. 6 and 7, in the method of manufacturing the motherboard 2, the second motherboard pixel defining sub-layer 122' and the spacers 13 are formed through a same patterning process using a same dielectric material doped with the same conductive material. For example, the dielectric material is polyimide.

For example, a first dielectric layer is first formed by using the same dielectric material doped with the same conductive material through a film-forming process, for example, a spin-coating process, and then the first dielectric layer is patterned through the same patterning process to form the second motherboard pixel defining sub-layer 122' and the spacers 13.

It will be noted that the "patterning process" in the description and claims includes, for example, coating photoresist, exposing the coated photoresist, developing the exposed photoresist, etching (for example, a wet etching process), and removing photoresist. The patterned film formed through the patterning process may be continuous or discontinuous, different portions of the patterned film may be at different heights, and the different portions may have different thicknesses. For example, the second motherboard pixel defining sub-layer 122' and the spacers 13 formed through the same patterning process are at different heights.

Figure 8:
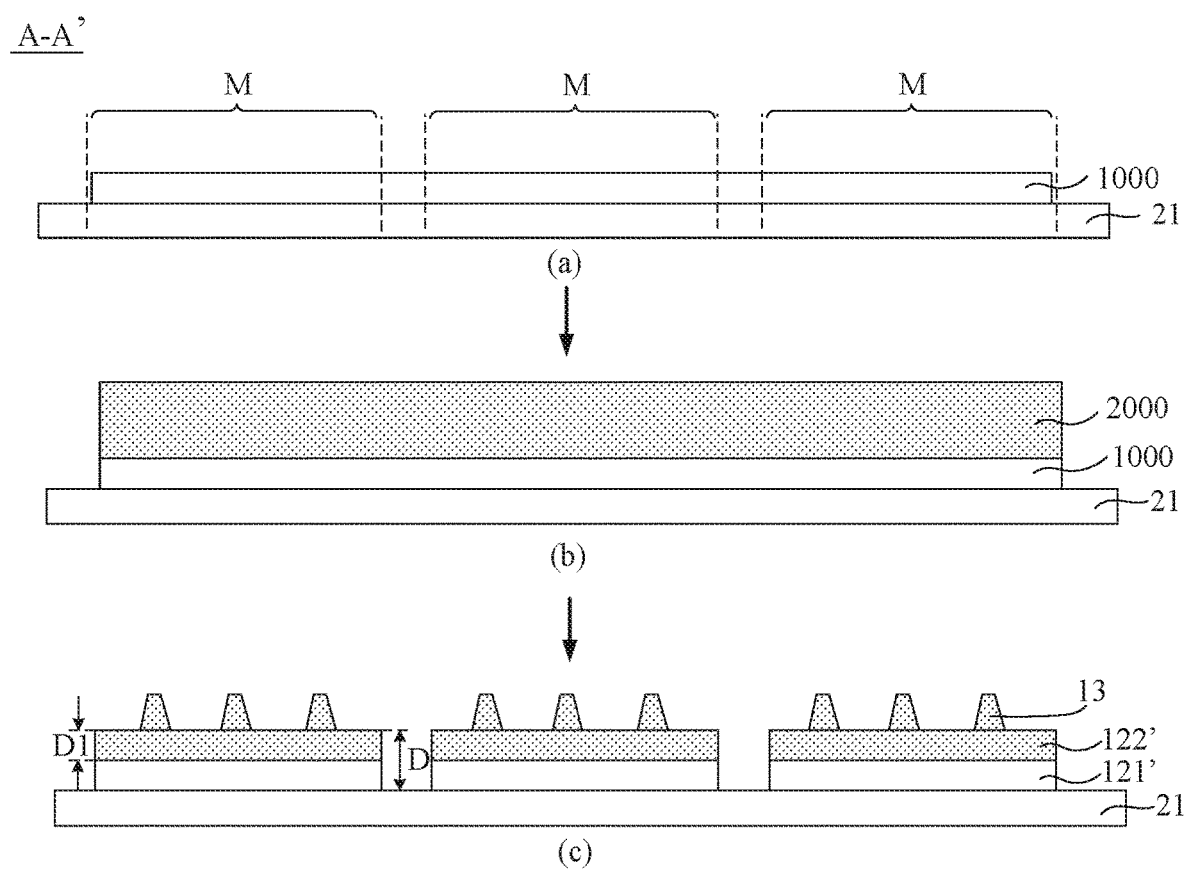
FIG. 8 is a schematic diagram showing steps of a method of manufacturing a motherboard, in accordance with some embodiments.
Figure 9:
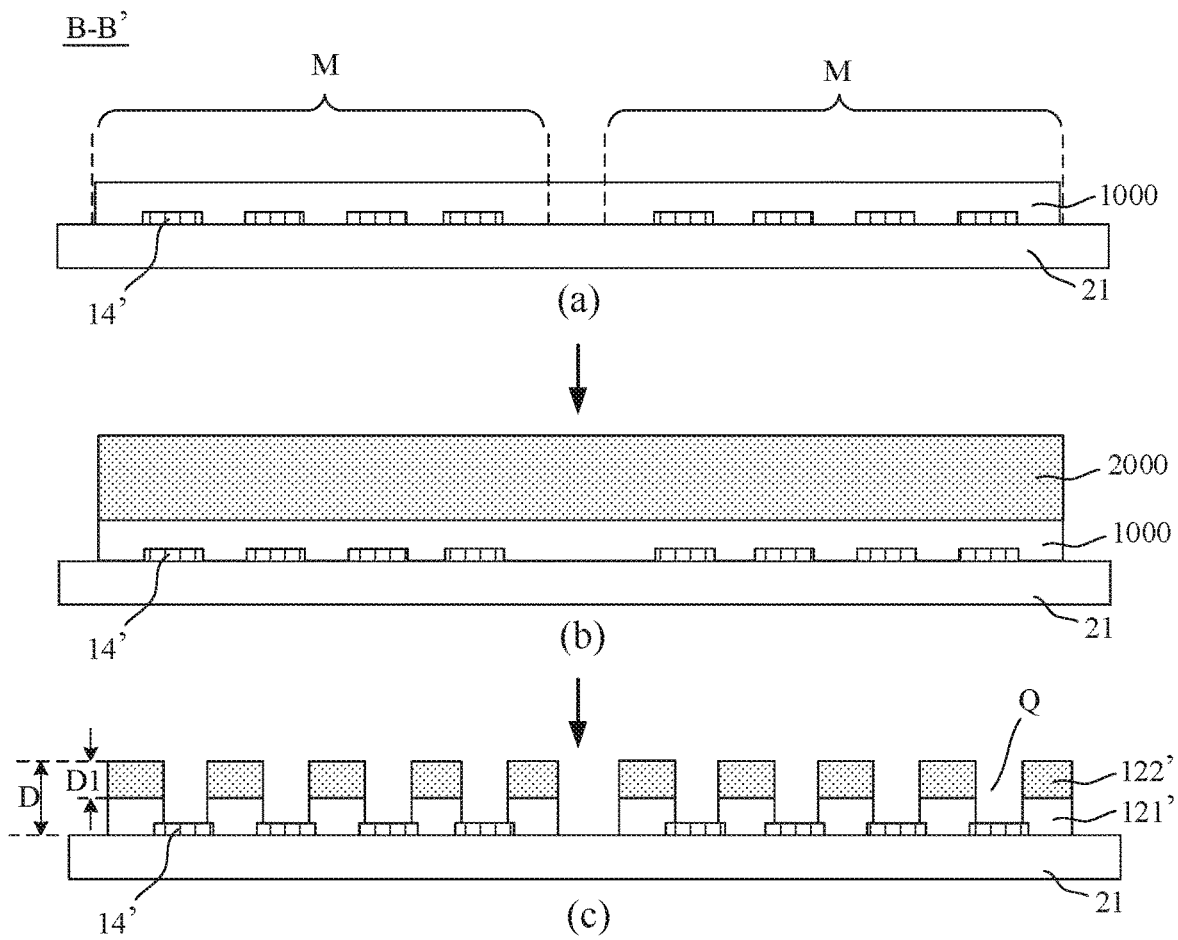
FIG. 9 is a schematic diagram showing steps of another method of manufacturing a motherboard, in accordance with some embodiments.
Figure 10:
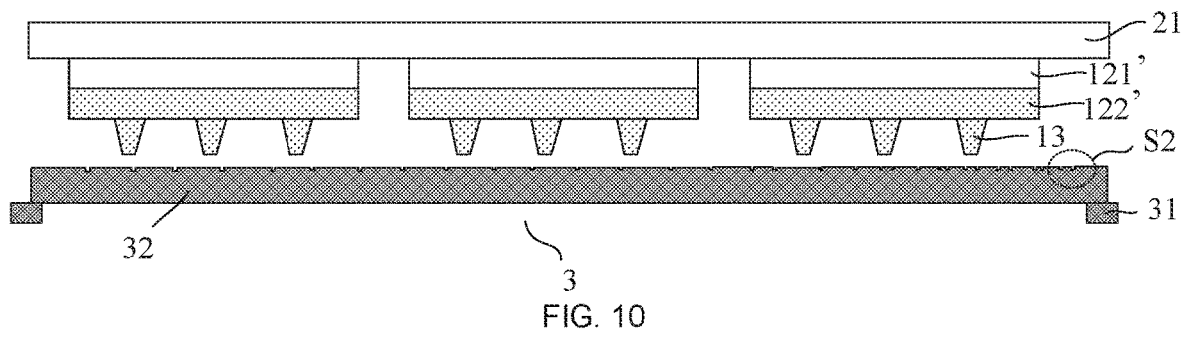
FIG. 10 is a schematic diagram showing an evaporation process of a motherboard in which a mask is used, in accordance with some embodiments.

On this basis, the method of manufacturing the motherboard 2 will be described below with reference to FIGS. 8 and 9 by taking the first dielectric material, the second dielectric material and the third dielectric material being the same dielectric material (abbreviated as "dielectric material" below) and the first conductive material and the second conductive material being the same conductive material (abbreviated as "conductive material" below) as an example. The dielectric material is, for example, polyimide. It will be noted that FIG. 8 is the section of the motherboard 2 shown in FIG. 4 along the section line A-A', and FIG. 9 is the section of the motherboard 2 shown in FIG. 4 along the section line B-B'. The line B-B' does not pass through any spacer 13, and thus the spacers 13 are not shown in FIG. 9.

The following are steps of forming the first motherboard pixel defining sub-layer 121', the second motherboard pixel defining sub-layer 122', and the spacers 13.

Referring to part (a) in FIG. 8 and part (a) in FIG. 9, a third dielectric layer 1000 is formed on the second base 21 by using the dielectric material. For example, a spin-coating process is used to form the third dielectric layer 1000 on the second base 21.

Referring to part (b) in FIG. 8 and part (b) in FIG. 9, a first dielectric layer 2000 is formed on the third dielectric layer 1000 by using the dielectric material doped with the conductive material. For example, a spin-coating process is used to form the first dielectric layer 2000 on the third dielectric layer 1000.

Referring to part (c) in FIG. 8 and part (c) in FIG. 9, the first dielectric layer 2000 is patterned through a patterning process to form the second motherboard pixel defining sub-layer 122' and the spacers 13, and the third dielectric layer 1000 is patterned to form the first motherboard pixel defining sub-layer 121'.

For example, the third dielectric layer 1000 and the first dielectric layer 2000 may be etched by using a wet etching process in the patterning process. It will be noted that since the first dielectric material, the second dielectric material and the third dielectric material are the same dielectric material, the third dielectric layer 1000 and the first dielectric layer 2000 may be etched by using a same etching liquid.

It will be noted that, in some other embodiments, the first motherboard pixel defining sub-layer 121', the second motherboard pixel defining sub-layer 122', and the spacers 13 may be formed separately by respective patterning processes. Or, the first motherboard pixel defining sub-layer 121' is formed by a patterning process, and the second motherboard pixel defining sub-layer 122' and the spacers 13 are formed by another patterning process.

For example, the third dielectric layer 1000 is formed on the second base 21 by using the dielectric material, and the third dielectric layer 1000 is patterned to form the first motherboard pixel defining sub-layer 121'. Then, a film is formed on the first motherboard pixel defining sub-layer 121' by using the dielectric material doped with the conductive material and is patterned to form the second motherboard pixel defining sub-layer 122'. After that, another film is formed on the second motherboard pixel defining sub-layer 122' by using the dielectric material doped with the conductive material and is patterned to form the spacers 13.

In some embodiments, before the second motherboard pixel defining sub-layer 122' and the spacers 13 are formed, the method of manufacturing the motherboard 2 further includes: doping the conductive material into the dielectric material to obtain the dielectric material doped with the conductive material. For example, the dielectric material is doped with at least one of graphite or carbon black. In addition, the conductive material doped into the dielectric material may also be other materials having conductive particles, and the material of the conductive material is not limited thereto.

It will be noted that the second base 21 may be a base with structures such as a pixel driving circuit matrix or the like formed thereon. The pixel driving circuit matrix may include an active layer, a first insulating layer, a gate metal layer, a second insulating layer and a source-drain metal layer.

In some embodiments, the second base 21 in S10 is a base above which an anode layer 14' has been formed. In this case, before performing S10, the method of manufacturing the motherboard 2 further includes: forming the anode layer 14' above the second base 21. Here, in a case where the second base 21 is a base on which the pixel driving circuit matrix has been formed, the anode layers 14' is formed on a side of the source-drain metal layer in the pixel driving circuit matrix away from the second base 21.

In some embodiments, as shown in FIGS. 10 to 13, after the spacers 13 are formed in S12, the method of manufacturing the motherboard 2 further includes: placing the mask 3 in a way that a surface thereof formed with a plurality of grooves K is in contact with the spacers 13, and evaporating an organic material functional layer 15 in each opening Q defined by the first motherboard pixel defining sub-layer 121' and the second motherboard pixel defining sub-layer 122'.

On this basis, in some embodiments, after the organic material functional layers 15 are evaporated, the method of manufacturing the motherboard 2 further includes: forming a cathode layer 16' on the organic functional layers 15 (shown in FIG. 4). After the cathode layer 16' is formed in the motherboard 2, the cathode layer 16' is in contact with the second motherboard pixel defining sub-layer 122' and the spacers 13. In this way, it is equivalent to connecting a resistor in parallel to the cathode 16, so that a voltage loss on the cathode 16 may be reduced.

Some embodiments of the present disclosure provide a method of manufacturing a substrate, which may be used to manufacture the substrate 1. Referring to FIG. 4, the method includes cutting the motherboard 2 manufactured by the manufacturing method of the motherboard 2 to obtain a plurality of substrates 1.

The beneficial effects of the method of manufacturing the substrate provided by embodiments of the present disclosure are the same as the beneficial effects of the substrate 1 described above, and details are not described herein again.

Some embodiments of the present disclosure provide a mask 3. The mask 3 may be used in the method of manufacturing the motherboard 2 as described above to manufacture the motherboard 2 as described above or the substrate 1 as described above.

As shown in FIGS. 10 to 13, the mask 3 includes a frame 31 and a mask body 32 fixed to the frame 31. A plurality of grooves K are formed in a surface of the mask body 32 facing away from the frame 31. A dimension of the cross section (e.g., a diameter or any side length of the cross section) of each groove K is 1 µm to 5 µm. A depth of the groove K is greater than 0 µm, and less than or equal to 3 µm.

It will be noted that, in a case where the mask 3 is used in the method of manufacturing the motherboard 2, the surface of the mask body 32 provided with the plurality of grooves K is in contact with the spacers 13 during the evaporation process, that is, the surface of the mask body 32 facing away from the frame 31 is in contact with the spacers 13.

In this way, the plurality of grooves K disposed in the surface of the mask body 32 facing away from the frame 31 may reduce the contact area between the mask body 32 and the motherboard 2. Therefore, when the mask 3 and the motherboard 2 are separated after the evaporation, the separation force between the two is reduced and the friction is reduced, so that the accumulation of electrostatic charge on the motherboard 2 may be reduced.

The plurality of grooves K may be formed in the surface of the mask body 32 facing away from the frame 31 by roughening the surface. For example, the surface may be roughened through a wet etching process.

It will be noted that by limiting the dimension of the cross section of a groove K to a range of 1 µm to 5 µm, the diameter of the upper opening of the groove K may be limited to be smaller than the diameter of the surface of a spacer 13 facing away from the second base 21. In addition, by limiting the depth of the groove K is limited to be greater than 0 µm and less than or equal to 3 µm, it is possible to prevent grooves K from affecting a supporting effect of the spacers 13 during the evaporation process.

Figure 11:
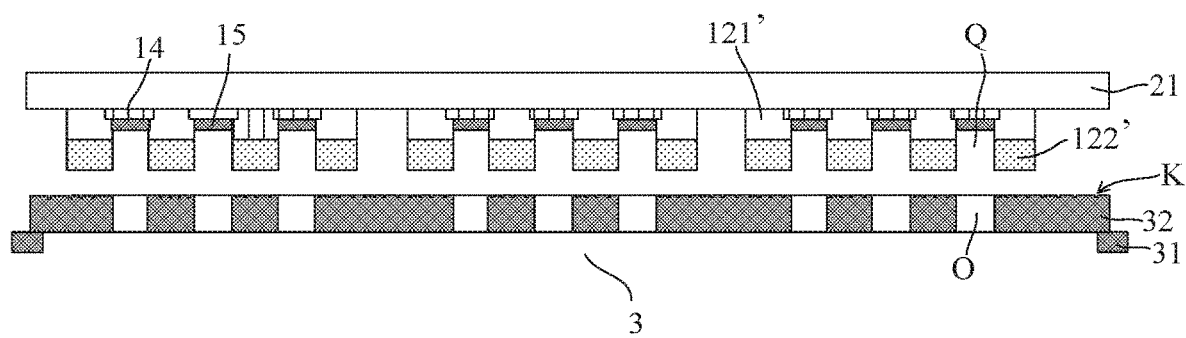
FIG. 11 is another schematic diagram showing the evaporation process of the motherboard in which the mask is used, in accordance with some embodiments.
Figure 12:
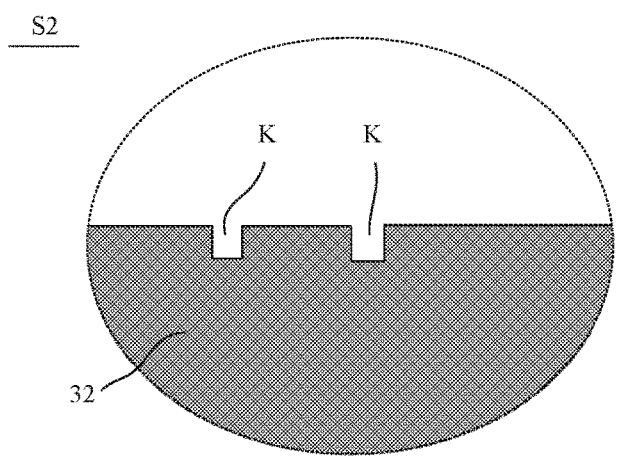
FIG. 12 is a partial enlargement view of the region S2 in FIG. 10.
Figure 13:
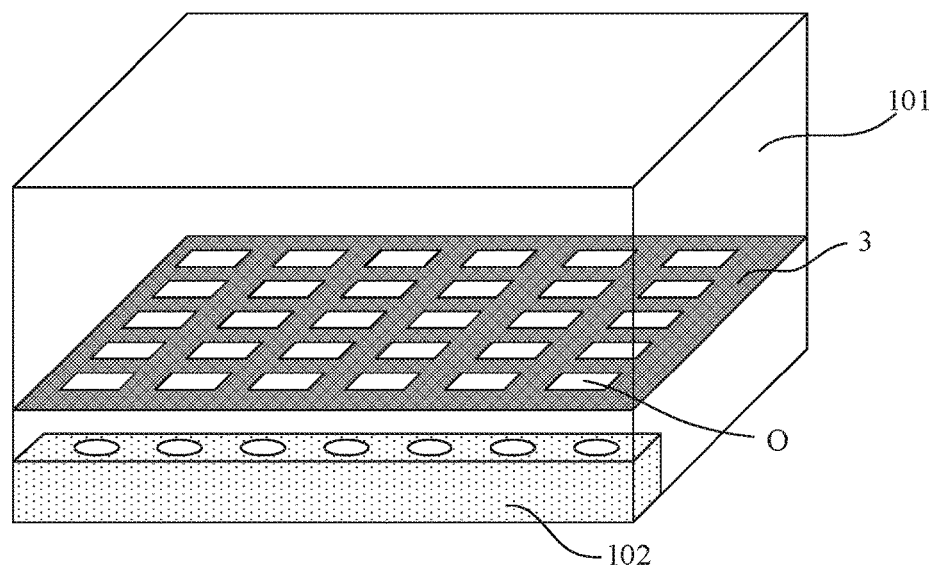
FIG. 13 is a schematic diagram showing a structure of an evaporation device, in accordance with some embodiments.

For example, referring to FIG. 11, the mask body 32 has a plurality of openings O extending through the mask body 32, and the plurality of openings O are in one-to-one correspondence with the openings Q in the first motherboard pixel defining sub-layer 121' and the second motherboard pixel defining sub-layer 122'. During the evaporation, evaporation materials are evaporated into openings Q through the corresponding openings O.

In this case, by limiting the dimensions of the grooves K to a range of 1 µm to 5 µm, sizes of the grooves K may be limited to a smaller range, so that an influence made by the grooves K to the openings O may be avoided, and an influence on an evaporation precision by the grooves K in the mask 3 may be avoided.

Some embodiments of the present disclosure provide an evaporation device 100. Referring to FIG. 11, the evaporation device 100 includes a cavity 101, and an evaporation source 102 and the mask 3 that are disposed in the cavity 101.

The evaporation device 100 has the same beneficial effects as the mask 3, which will not be described in detail here.

The forgoing descriptions are merely specific implementation manners of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A substrate, comprising:
a first base;
a pixel defining layer disposed above the first base, the pixel defining layer having a plurality of openings, and including a first pixel defining sub-layer and a second pixel defining sub-layer stacked in a direction away from the first base; and
spacers disposed on a surface of the pixel defining layer facing away from the first base, wherein
the second pixel defining sub-layer includes a first conductive material doped at least in a surface of the second pixel defining sub-layer facing away from the first base; the spacers include a second conductive material doped at least in surfaces of the spacers facing away from the first base.

2. The substrate according to claim 1, wherein a thickness of the second pixel defining sub-layer is approximately ⅓ to approximately ½ of a thickness of the pixel defining layer.

3. The substrate according to claim 1, further comprising an organic material functional layer disposed in each opening, wherein a thickness of the first pixel defining sub-layer is greater than a thickness of the organic material functional layer.

4. The substrate according to claim 1, wherein the second pixel defining sub-layer includes a first dielectric material doped with a first conductive material, and the spacers include a second dielectric material doped with a second conductive material.

5. The substrate according to claim 4, wherein the first conductive material in the second pixel defining sub-layer has a doping concentration of 1 wt % to 10 wt %, and the second conductive material in the spacers has a doping concentration of 1 wt % to 10 wt %.

6. The substrate according to claim 1, wherein a material of the second pixel defining sub-layer and a material of the spacers are a same dielectric material doped with a same conductive material.

7. The substrate according to claim 1, wherein the first conductive material includes at least one of carbon black or graphite, and the second conductive material includes at least one of carbon black or graphite.

8. The substrate according to claim 1, wherein a material of the first pixel defining sub-layer is a third dielectric material.

9. The substrate according to claim 3, further comprising:
a plurality of anodes disposed between the first base and the pixel defining layer, each anode corresponds to a respective one of the plurality of openings; and
a cathode covering the organic material functional layer, the pixel defining layer and the spacers.

10. A method of manufacturing a motherboard including a plurality of substrates according to claim 1, the method comprising:
forming a first motherboard pixel defining sub-layer above a second base by using a third dielectric material;
forming a second motherboard pixel defining sub-layer on the first motherboard pixel defining sub-layer by using a first dielectric material doped with the first conductive material; and
forming spacers on the second motherboard pixel defining sub-layer by using a second dielectric material doped with the second conductive material.

11. The method according to claim 10, wherein a thickness of the second motherboard pixel defining sub-layer is approximately ⅓ to approximately ½ of a sum of a thicknesses of the first motherboard pixel defining sub-layer and a thickness of the second motherboard pixel defining sub-layer.

12. The method according to claim 10, wherein the second motherboard pixel defining sub-layer and the spacers are formed through one patterning process by using a same dielectric material doped with a same conductive material.

13. The method according to claim 12, wherein the first dielectric material, the second dielectric material, and the third dielectric material are a same dielectric material.

14. The method according to claim 13, wherein forming the first motherboard pixel defining sub-layer, the second motherboard pixel defining sub-layer, and the spacers includes:
- forming a third dielectric layer on the second base by using the same dielectric material;
- forming a first dielectric layer on the third dielectric layer by using the same dielectric material doped with the same conductive material;
- patterning the first dielectric layer to form the second motherboard pixel defining sub-layer and the spacers; and
- patterning the third dielectric layer to form the first motherboard pixel defining sub-layer.

15. The method according to claim 12, wherein before forming the second motherboard pixel defining sub-layer and the spacers, the method further comprises:
- doping the same conductive material into the same dielectric material to obtain the same dielectric material doped with the same conductive material.

16. The method according to claim 10, wherein after forming the spacers, the method further comprises:
- placing a mask in a way that a surface of the mask formed with a plurality of grooves is in contact with the spacers; and
- evaporating an organic material functional layer in an opening defined by the first motherboard pixel defining sub-layer and the second motherboard pixel defining sub-layer, a thickness of the organic material functional layer being smaller than a thickness of the first motherboard pixel defining sub-layer.

17. A method of manufacturing the substrate according to claim 1, comprising:
- cutting the motherboard manufactured by the method according to claim 10 to obtain the substrate.

18. A mask applied in manufacturing the substrate according to claim 1, the mask comprising:
- a frame; and
- a mask body fixed on the frame, wherein a plurality of grooves are formed in a surface of the mask body facing away from the frame, and a dimension of a cross section of each groove ranges from 1 μm to 5 μm, and a depth of the groove is greater than 0 μm, and less than or equal to 3 μm.

19. An evaporation device, comprising:
- a cavity;
- an evaporation source disposed in the cavity; and
- the mask according to claim 18 disposed in the cavity.

* * * * *